United States Patent
Lu

(10) Patent No.: US 7,927,660 B2
(45) Date of Patent: Apr. 19, 2011

(54) METHOD OF MANUFACTURING NANO-CRYSTALLINE SILICON DOT LAYER

(75) Inventor: Chi-Pin Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 612 days.

(21) Appl. No.: 11/465,883

(22) Filed: Aug. 21, 2006

(65) Prior Publication Data
US 2008/0044574 A1   Feb. 21, 2008

(51) Int. Cl.
C23C 28/00 (2006.01)
H01L 21/336 (2006.01)

(52) U.S. Cl. ............ 427/248.1; 438/257; 438/263; 438/264; 117/935

(58) Field of Classification Search .......... None
See application file for complete search history.

(56) References Cited

U.S. PATENT DOCUMENTS

| | | | |
|---|---|---|---|
| 5,946,588 A * | 8/1999 | Ahmad et al. | 438/585 |
| 6,090,666 A * | 7/2000 | Ueda et al. | 438/257 |
| 6,300,193 B1 | 10/2001 | Forbes | |
| 6,344,403 B1 * | 2/2002 | Madhukar et al. | 438/503 |
| 6,878,578 B1 | 4/2005 | Twu et al. | |
| 2002/0068457 A1 * | 6/2002 | Kim | 438/694 |
| 2002/0173085 A1 * | 11/2002 | Nakajima et al. | 438/149 |
| 2004/0048441 A1 * | 3/2004 | Akatsu et al. | 438/386 |
| 2005/0272198 A1 * | 12/2005 | Hamamura et al. | 438/230 |
| 2006/0145136 A1 * | 7/2006 | Verhoeven | 257/14 |
| 2007/0087492 A1 * | 4/2007 | Yamanaka | 438/166 |

OTHER PUBLICATIONS

Nakajima, A. Jpn. J. Appl. Phys. 1, 35, L189, 1996.*
Fukuda, Applied Physics Letters, V70, 17, Apr. 28, 1997, p. 2291-2293.*

* cited by examiner

Primary Examiner — Timothy H Meeks
Assistant Examiner — Joseph Miller, Jr.
(74) Attorney, Agent, or Firm — J.C. Patents

(57) ABSTRACT

A method of manufacturing a nano-crystalline silicon dot layer is provided. A silicon layer is formed over a substrate. The silicon layer includes crystalline silicon region and amorphous silicon region. An oxidation process is performed to oxidize the amorphous silicon region and the surfaces of the crystalline silicon region to form a silicon oxide layer containing nano-crystalline silicon dots.

16 Claims, 2 Drawing Sheets

METHOD OF MANUFACTURING NANO-CRYSTALLINE SILICON DOT LAYER

BACKGROUND OF THE INVENTION

1. Field of the Invention

The present invention generally relates to a method of manufacturing a semiconductor material layer, and more particularly, to a method of manufacturing a nano-crystalline silicon dot layer.

2. Description of Related Art

Memory devices derived from various semiconductor fabrication techniques such as dynamic random access memory (DRAM), static random access memory (SRAM), non-volatile random access memory (NVRAM) play a critical role in the semiconductor industry. With the gradual maturity of the processing techniques, these memories are widely adopted inside some of the popular electronic products including personal computers, mobile phones and networks.

However, as the size of newer generation of semiconductors continues to be miniaturized, of the size of the memories must also be correspondingly reduced, which is challenging. For example, the leakage current of a DRAM may lead to a large consumption of power, the area occupied by a SRAM may be too large and a higher voltage may be required to read/write flash memory data. Therefore, new types of memory devices having a higher density, lower memory volatility, faster read/write speed, unlimited access, low operating voltage, lower power consumption and compatibility with existing CMOS devices are highly demanded.

At present, among the newly developed memory devices, nano-dot non-volatile memory is more promising. Nano-dot non-volatile memory device is a memory device having a plurality of nano-dots formed in the charge storage layer such that each of the nano-dots may serve as an independent charge storage center. Thus, even if a leakage pathway is established within the tunneling oxide layer, the nano-dot non-volatile memory can still maintain a good charge retention capability. Moreover, as the size of the nano-dot memory is reduced, the nano-dot memory can still utilize its special properties to store charges inside the nano-crystalline dot layer and maximize the charge storage capacity of a memory storage device. Nowadays, research on silicon nano-crystalline dots, germanium nano-crystalline dots and metallic nano-dots progress at a fast pace because the nano-crystalline dot layers serving as a charge storage layers may replace the conventional silicon nitride charge storage layers.

A conventional method of forming a silicon nano-crystalline dot layer includes performing an ion implantation so that silicon is implanted into a silicon oxide layer and then performing a high-temperature annealing operation to crystallize the silicon into nano-crystalline dots. Another method of forming the nano-crystalline dot layer includes depositing crystalline silicon dots in particle form on a substrate in a low-pressure chemical vapor deposition process. Thereafter, silicon oxide is deposed to cover the crystalline silicon dots in a high-temperature oxidation (HTO) process so that the crystalline silicon dots are isolated from each other. However, the first method of using implanted silicon to form the crystalline silicon dots often leads to significant structural damage of the silicon oxide layer and causes insulation problems between crystalline silicon dots. The second method of performing a high-temperature oxidation process to form a silicon oxide layer over the crystalline silicon dots is difficult to completely cover all the crystalline silicon dots. Therefore, the insulation effect between the crystalline silicon dots is poor and ultimately may seriously affect the reliability of the device.

SUMMARY OF THE INVENTION

Accordingly, at least one objective of the present invention is to provide a method of manufacturing a nano-crystalline dot layer having an improved insulation between the crystalline silicon dots so that devices with the nano-crystalline dot layer can have a better reliability.

To achieve these and other advantages and in accordance with the purpose of the invention, as embodied and broadly described herein, the invention provides a method of manufacturing a nano-crystalline silicon dot layer. The method includes forming a silicon layer over a substrate. The silicon layer is a mixing structure with partial crystalline and partial amorphous. Thereafter, an oxidation process is performed so that all the amorphous silicon region and the surfaces of the crystalline silicon region are oxidized to form a silicon oxide layer containing nano-crystalline silicon dots.

According to one embodiment of the present invention, the foregoing method of forming a silicon layer over the substrate includes performing a chemical vapor deposition process.

According to one embodiment of the present invention, the foregoing chemical vapor deposition process is performed at a temperature between 540° C. to 560° C., a pressure of about 0.5 torr and silane at a gas flow rate of between 100 sccm~280 sccm is used as the reactive gas.

According to one embodiment of the present invention, an annealing process is performed to grow the crystalline silicon region after performing the chemical vapor deposition process but before performing the oxidation process.

According to one embodiment of the present invention, the foregoing annealing process is performed at a temperature between 500° C. to 600° C.

According to one embodiment of the present invention, the gas used in the foregoing annealing process includes nitrogen.

According to one embodiment of the present invention, the annealing time in the foregoing annealing process is between 3 hours to 5 hours.

According to one embodiment of the present invention, the foregoing oxidation process is performed using gaseous ozone with a concentration of about 80% to 100% or liquefied ozone with a concentration of about 17 mg/L or more as the oxidizing agent.

According to one embodiment of the present invention, the temperature of the liquefied ozone is between 50° C. to 80° C. and the temperature of the gaseous ozone is between 500° C. to 600° C.

According to one embodiment of the present invention, a first dielectric layer is formed over the substrate before forming the foregoing silicon layer.

According to one embodiment of the present invention, a second dielectric layer on the silicon oxide layer containing nano-crystalline silicon dots is formed over the substrate after the foregoing oxidation process.

According to one embodiment of the present invention, the foregoing nano-crystalline silicon dot layer comprises a charge storage layer of a non-volatile memory device.

Because the silicon oxide layer on the surface of the nano-crystalline silicon dots is derived from oxidizing the surface of the original crystalline silicon region, the coverage between the silicon oxide and the nano-crystalline silicon dots is good. Moreover, since the nano-crystalline silicon dots are formed in a deposition process instead of an implant process, the silicon oxide between the nano-crystalline silicon dots will not be damaged. Hence, the insulating effect between the nano-crystalline silicon dots is significantly improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
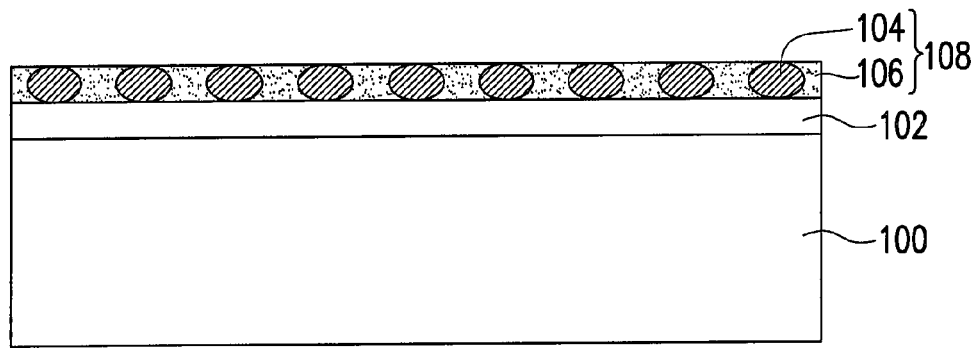
FIGS. 1A through 1C are schematic cross-sectional views showing the steps for fabricating a structure with a nano-crystalline silicon dot layer therein according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
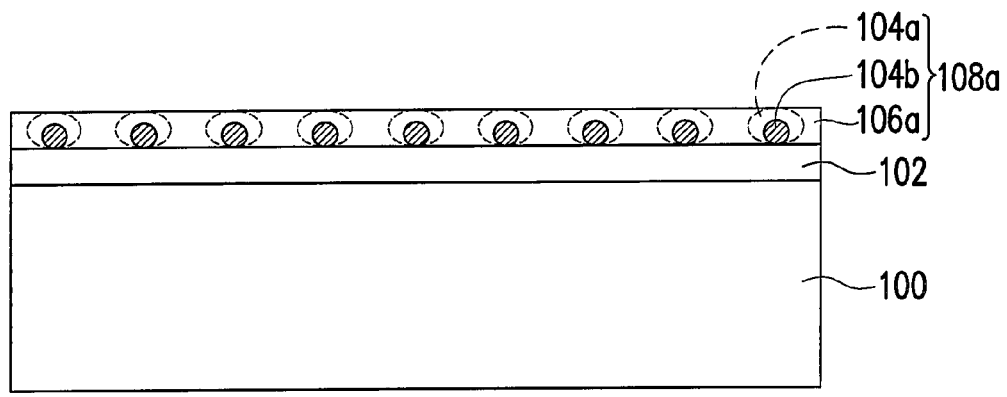
Figure 1C:
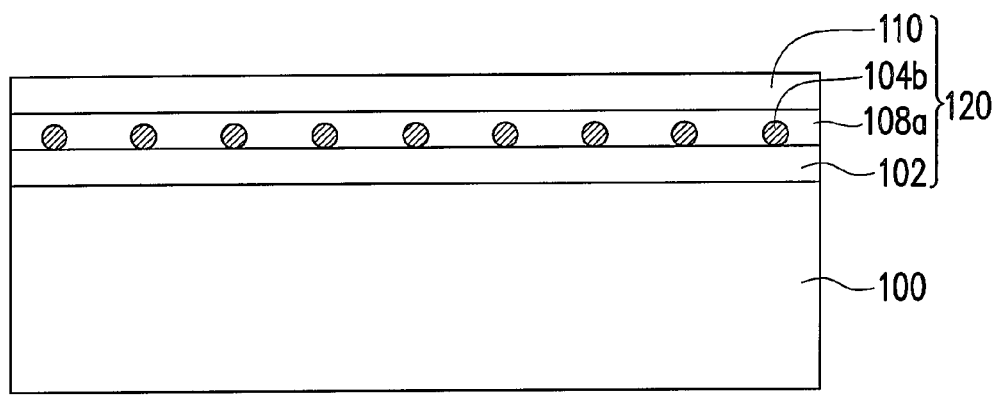

FIGS. 1A through 1C are schematic cross-sectional views showing the steps for fabricating a structure with a nano-crystalline silicon dot layer therein according to an embodiment of the present invention. As shown in FIG. 1A, the method includes forming a silicon layer 108 over a silicon oxide layer 102 on substrate 100. In one embodiment, the silicon layer 108 includes a partial crystalline silicon region 104 and a partial amorphous silicon region 106. The method of forming the silicon layer 108 including the partial crystalline silicon region 104 and the partial amorphous silicon region 106 includes performing only a chemical vapor deposition process. In another embodiment, the silicon layer 108 including the partial crystalline silicon region 104 and the partial amorphous silicon region 106 is formed by performing only a chemical vapor deposition process at a temperature between 540° C. to 560° C. and a pressure of about 0.5 ton and using silane with a flow rate of between 100 sccm to 280 sccm as the reactive gas. After performing the chemical vapor deposition process, an annealing process can be performed to grow the crystalline silicon region 104 which has formed in the silicon layer 108. The annealing process is performed using a nitrogen-containing gas such as nitrogen at a temperature between 500° C. to 600° C. for an annealing period of between 3 hours to 5 hours.

As shown in FIG. 1B, an oxidation process is performed utilizing the high oxidation rate of amorphous silicon and the low oxidation rate of the crystalline silicon. Thus, all the amorphous silicon regions 106 are oxidized into silicon oxide 106a and the surface of the crystalline silicon region 104 is oxidized into silicon oxide 104a. Meanwhile, any un-oxidized interior content of the crystalline silicon region 104 form nano-crystalline silicon dots 104b, thereby completing the formation of the nano-crystalline silicon dot layer 108a. The oxidation process can be performed using a gaseous oxidizing agent, but much better using gaseous ozone or liquefied ozone with higher ozone concentration and lower process temperature. Oxidation in lower temperature process will enhance the different of oxidation rate between crystalline silicon and amorphous silicon. The concentration of the gaseous ozone is about 80% to 100%. The concentration of liquefied ozone is about 17 mg/L or more. The temperature of the liquefied ozone is between 50° C. to 80° C. and the temperature of the gaseous ozone is between 500° C. to 600° C.

Again, as shown in FIG. 1A, before forming the foregoing silicon layer 108 on the substrate 100, a dielectric layer 102 is formed over the substrate 100 in another embodiment. Moreover, after forming the nano-crystalline silicon dot layer 108a, the nano-crystalline silicon dot layer 108a may be covered with another dielectric layer 110 to form a stacked structure 120 as shown in FIG. 1C. The dielectric layer 102 is a silicon oxide layer formed, for example, by performing a thermal oxidation process. The dielectric layer 102 preferably has a thickness between 40 Å to 50 Å. The dielectric layer 110 can be fabricated using a material identical to or different from that of the dielectric layer 102. For example, the dielectric layer 110 is a silicon oxide layer formed, for example, by performing a chemical vapor deposition process. The dielectric layer 110 preferably has a thickness between 40 Å to 50 Å.

Figure 2:
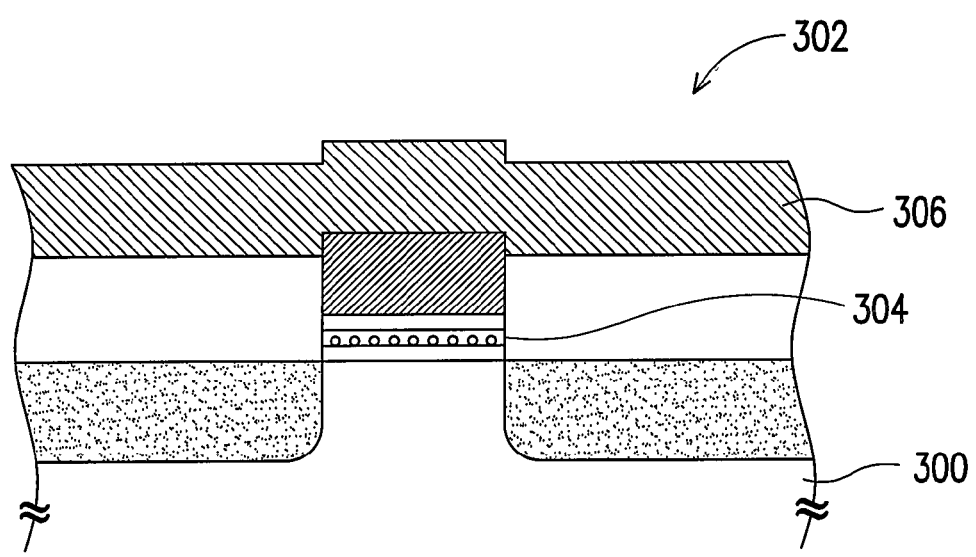
FIG. 2 is a schematic cross-sectional view of a structure with a nano-crystalline silicon dot layer therein replacing the oxide/nitride/oxide structure of a SONOS device.

The foregoing nano-crystalline silicon dot layer can serve as a charge storage layer in a non-volatile memory device. As shown in FIG. 2, the foregoing nano-crystalline silicon dot layer can be used in a SONOS device 302 replacing the conventional oxide/nitride/oxide composite layer to serve as a charge storage layer 304 between a control gate 306 and a substrate 300.

Because the silicon oxide layer on the surface of the nano-crystalline silicon dots is derived from oxidizing the surface of the original crystalline silicon region, the coverage between the silicon oxide and the nano-crystalline silicon dots is good. In addition, the nano-crystalline silicon dots are formed in a deposition process instead of an implant process. Hence, the silicon oxide between the nano-crystalline silicon dots will not be damaged. As a result, the insulating effect between the nano-crystalline silicon dots is significantly improved. When the nano-crystalline silicon dot layer is used inside a non-volatile memory device, the device has a better reliability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a nano-crystalline silicon dot layer, comprising the steps of:
   performing only a chemical vapor deposition process to deposit a silicon layer over a substrate, wherein the silicon layer comprises a partial crystalline silicon region and a partial amorphous silicon region, wherein the chemical vapor deposition process is performed at a temperature from 540° C. to 560° C., a pressure of about 0.5 torr and using silane with a gas flow rate from 100 sccm to 280 sccm as a reactive gas; and
   performing an oxidation process to oxidize the amorphous silicon region and a surface of the crystalline silicon region into a silicon oxide to form a silicon oxide layer containing nano-crystalline silicon dots.

2. The method of claim 1, further comprising a step of performing an annealing process to grow the crystalline silicon region after the step of performing only the chemical vapor deposition process but before the step of performing the oxidation process.

3. The method of claim 2, wherein the annealing process is performed at a temperature from 500° C. to 600° C.

4. The method of claim 2, wherein the gas used in the annealing process comprises nitrogen.

5. The method of claim 2, wherein a duration of the annealing process is from 3 to 5 hours.

6. The method of claim 1, wherein gaseous ozone with a concentration of about 80% to 100% or liquefied ozone with a concentration of about 17 mg/L or more is used as an oxidizing agent in the oxidation process.

7. The method of claim 6, wherein the temperature of the liquefied ozone is from 50° C. to 80° C. and the temperature of the gaseous ozone is from 500° C. to 600° C.

8. A method of fabricating a dielectric layer containing nano-crystalline silicon dots, comprising the steps of:
   forming a first dielectric layer over a substrate;
   performing only a chemical vapor deposition process to deposit a silicon layer over the first dielectric layer, wherein the silicon layer comprises a partial crystalline silicon region and a partial amorphous silicon region, wherein the chemical vapor deposition process is performed at a temperature from 540° C. to 560° C., a pressure of about 0.5 ton and using silane with a gas flow rate from 100 sccm to 280 sccm as a reactive gas;
   performing an oxidation process to oxidize the amorphous silicon region and a surface of the crystalline silicon region into a silicon oxide to form a silicon oxide layer with nano-crystalline silicon dots therein; and
   forming a second dielectric layer over the silicon oxide layer containing nano-crystalline silicon dots.

9. The method of claim 8, further comprising a step of performing an annealing process to grow the crystalline silicon region after the step of performing only the chemical vapor deposition process but before the step of performing the oxidation process.

10. The method of claim 9, wherein the annealing process is performed at a temperature from 500° C. to 600° C.

11. The method of claim 9, wherein the gas used in the annealing process comprises nitrogen.

12. The method of claim 9, wherein a duration of the annealing process is from 3 to 5 hours.

13. The method of claim 8, wherein gaseous ozone with a concentration of 80% to 100% or liquefied ozone with a concentration of 17 mg/L is used as an oxidizing agent in the oxidation process.

14. The method of claim 13, wherein the temperature of the liquefied ozone is from 50° C. to 80° C. and the temperature of the gaseous ozone is from 500° C. to 600° C.

15. The method of claim 8, wherein the nano-crystalline silicon dot layer is a charge storage layer for a non-volatile memory device.

16. The method of claim 8, wherein the first dielectric layer is formed by a thermal oxidation process.

* * * * *